United States Patent
Ott

(10) Patent No.: US 6,957,238 B1
(45) Date of Patent: Oct. 18, 2005

(54) METHOD AND SYSTEM FOR DETERMINISTIC PSEUDO-RANDOM VALID ENTRY RESOLUTION

(75) Inventor: Michael L. Ott, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 866 days.

(21) Appl. No.: 09/792,599

(22) Filed: Feb. 23, 2001

(51) Int. Cl.$^7$ ............................................. G06F 15/00
(52) U.S. Cl. ........................................ 708/211; 710/40
(58) Field of Search .................... 708/211; 710/40, 710/41, 42, 43, 44, 45, 244

(56) References Cited

U.S. PATENT DOCUMENTS

| | | | | |
|---|---|---|---|---|
| 5,091,874 A | * | 2/1992 | Watanabe et al. ........... | 708/211 |
| 5,504,697 A | * | 4/1996 | Ishida ......................... | 708/552 |
| 5,881,313 A | * | 3/1999 | Ramakrishnan et al. ...... | 710/40 |
| 5,974,432 A | * | 10/1999 | Orup .......................... | 708/205 |
| 6,195,673 B1 | * | 2/2001 | Park ........................... | 708/211 |

* cited by examiner

Primary Examiner—Chuong D Ngo
(74) Attorney, Agent, or Firm—Martine Penilla & Gencarella, LLP

(57) ABSTRACT

The present invention provides a method and system to select a valid entry in a deterministic pseudo-random approach. The method may randomly select one of numerous valid entries in order to ensure that no specific entry or set of entries is consistently ignored. Moreover, the method may be deterministic in order that the selection technique could be precisely controlled for purposes such as testing and predetermined selection. The method of the present invention may be carried out in five parts: first, the total range of entries is divided into regions, each of which is further divided into one or more sub-regions; pre-determined or constantly-changing weighting is assigned to each region in the second step; an OR operation is then performed on the entries of each sub-region to determine which of the sub-regions, if any, contains no valid entries and thus may be disregarded in the final step; the weightings assigned in step two are examined in order to select a sub-region from a region where more than one sub-region contains valid entries. Furthermore, the final step combines the original entry's signal with the appropriate collection of ignore signals, and effectively selects one entry as the final output.

10 Claims, 3 Drawing Sheets

METHOD AND SYSTEM FOR DETERMINISTIC PSEUDO-RANDOM VALID ENTRY RESOLUTION

FIELD OF INVENTION

The invention relates to the field of computer hardware, and in particular to a deterministic pseudo-random valid entry selection process.

BACKGROUND

In the design of hardware applications, it is often necessary to choose one valid entry from a set of valid inputs as the output. Furthermore, in situations where the output is not pre-determined, the resulting output entry must appear randomly chosen in order so that no specific entry or set of entries is consistently overlooked. Moreover, for testing and pre-determined selection purposes, the solution must also be deterministic. The present invention provides a deterministic pseudo-random algorithm that addresses the aforementioned issues.

SUMMARY OF INVENTION

The present invention provides the method and system to select a valid entry in a deterministic pseudo-random approach. The method may randomly select one of numerous valid entries in order to ensure that no specific entry or set of entries is consistently ignored. Moreover, the method may be deterministic in order that the selection technique could be precisely controlled for purposes such as testing and pre-determined selection.

The method of the present invention may be carried out in five parts: first, the total range of entries is divided into regions, each of which is further divided into one or more sub-regions; pre-determined or constantly-changing weighting is assigned to each region in the second step; an OR operation is then performed on the entries of each sub-region to determine which of the sub-regions, if any, contains no valid entries and thus may be disregarded in the final step; the weightings assigned in step two are examined in order to select a sub-region from a region where more than one sub-region contains valid entries. Furthermore, the final step combines the original entry's signal with the appropriate collection of ignore signals, and effectively selects one entry as the final output.

DETAILED DESCRIPTION

The present invention provides the method and system for a valid entry selection process whose result may be pseudo-random or pre-determined. Pseudo-random selection may be required to ensure that no specific entry or set of entries is consistently overlooked. Moreover, deterministic selection may be required for purposes such as testing or pre-determined (e.g. priority based, etc) selection. Regardless whether the selection is pseudo-random or pre-determined, the method selects one valid entry from the set of possible valid entries as the output.

The following description is presented to enable one of ordinary skill in the art to make and use the invention and is provided in the context of a patent application and its requirements. Various modifications to the embodiments will be readily apparent to those skilled in the art and the generic principles herein may be applied to other embodiments. Thus, the present invention is not intended to be limited to the embodiments shown but is to be accorded the widest scope consistent with the principles and features described herein.

Figure 1:
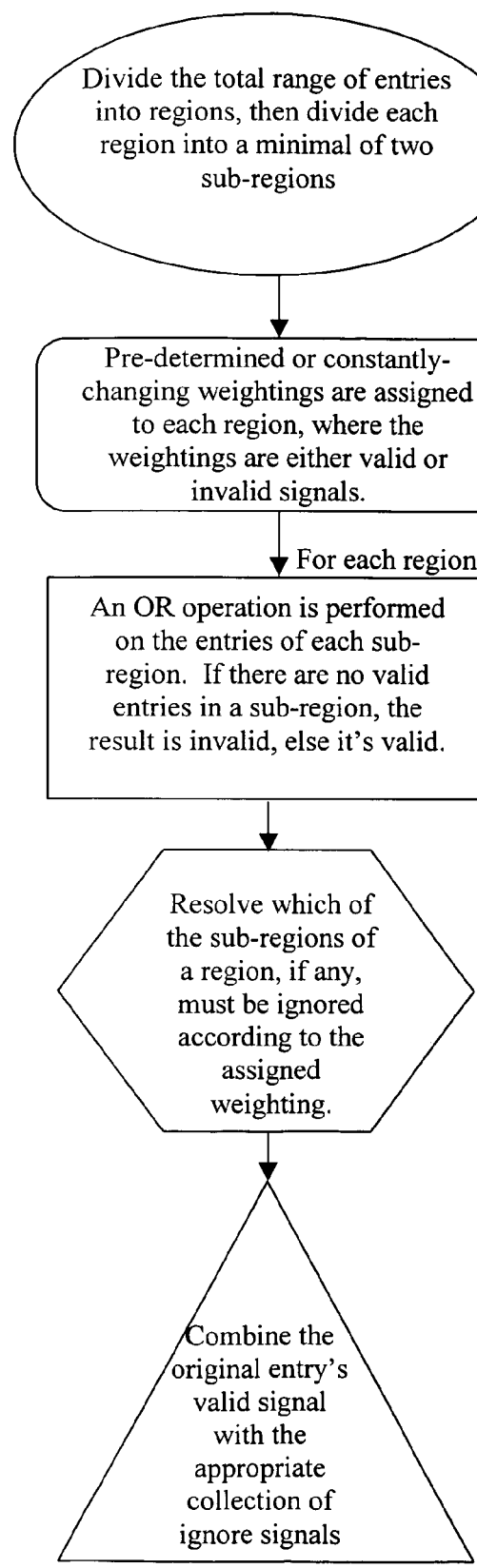
FIG. 1 is a flow diagram of the present invention.

FIG. 1 illustrates the five steps employed to execute the selection process. The five steps system is used strictly as an illustrative method and is not intended to limit the scope of the present invention. In the first step, the total range of the entries is divided into multiple regions, assuming the total range of entries is greater than one. Each region is further divided into one or more sub-regions. Pre-determined or constantly-changing weightings are assigned to each region in the second step. Subsequently, an OR operation is performed on the entries of each of the sub-regions. The operation results in an invalid signal if no valid entry exists in a sub-region, and results in a valid signal if at least one valid entry exists in a sub-region. Furthermore, the validity notion introduced in the following description is intended to distinguish between two polarities, many such embodiments of the concept exist in the field of logic design (e.g. logic "0" vs. logic "1", TRUE vs. FALSE, etc.), and is not to be construed to bound the scope of the invention. The fourth step resolves the selection of one sub-region for each region where more than one sub-region contains at least one valid entry. For each sub-region, steps three and four output a ignore signal, if the ignore signal is valid then the valid entries of the sub-region are ignored for the final output, else the sub-region either contains no valid entry or possibly contains the final output entry. Moreover, the weighting system employed by the fourth step provides the constantly-changing weightings necessary for pseudo-random selections. In the final step, the original validity of each entry is combined with the appropriate collection of ignore signals to eliminate all but one entry as the final valid output.

Table 1 shows the first step of one embodiment of the invention. The entry range of 32 (from entry 0 to entry 31, inclusive) is divided into regions whose size is a multiple of two. Hence, the entry range is divided into one region of size 32, two regions of size 16, four regions of size 8, eight regions of size 4, and 16 regions of size 2. Moreover, each region is uniformly redistributed into two sub-regions. As demonstrated by Table 1, region 1 is divided into a first sub-region from entry 0 to entry 15, and a second sub-region from entry 16 to entry 31; and region 2 is divided into a first sub-region from entry 16 to entry 23, and a second sub-region from entry 24 to entry 31; other regions are similarly sub-divided.

TABLE 1

| Region Index | Entries in Region | Sub-Regions of Region |
| --- | --- | --- |
| 1 | Entire 32 entries | 31:16, 15:0 |
| 2 | Upper 16 entries | 31:24, 23:16 |
| 3 | Lower 16 entries | 15:8, 7:0 |
| 4 | Upper 8 entries | 31:28, 27:24 |
| 5 | Upper middle 8 entries | 23:20, 19:16 |
| 6 | Lower middle 8 entries | 15:12, 11:8 |
| 7 | Lower 8 entries | 7:4, 3:0 |

TABLE 1-continued

| Region Index | Entries in Region | Sub-Regions of Region |
|---|---|---|
| 8 | Upper four entries | 31:30, 29:28 |
| ... | The other seven regions each containing 4 entries | Divided evenly as shown above |
| 16 | Upper 2 entries | 31, 30 |
| ... | The other fourteen regions between the upper and the lowest regions where each contains 2 entries | Divided evenly as shown above |
| 31 | Lowest 2 entries | 1, 0 |

In step three of the present invention, an OR operation is performed on the entries of each sub-region. As an example, an OR operation is performed on the entries 16 to 31, which encompass the upper sub-region of region 1. If any entry from 16 to 31 is valid then the result of the operation is a valid signal, else the result is an invalid signal. The operation is similarly applied to all sub-regions listed in Table 1.

Table 2 shows the four possible results for each region after step three. In the first case, neither of the two sub-regions contains a valid entry and the result of step three is an invalid signal for both. This first case requires no decision to ignore any of the sub-regions since none contains any valid entry and therefore cannot possibly contain a viable output entry. In the second case, the upper sub-region of a region results in an invalid signal after step three and may be disregarded, the lower sub-region results in a valid signal after step three and thus contains at least one valid entry. The second case also does not call for a decision to be made between the sub-regions since only valid entries may be considered in the last step and the upper sub-region contains none. The third case is similar to the second, the role of upper and lower sub-regions are reversed and the upper sub-region contains at least one valid entry whereas the lower sub-region contains none and thus should be ignored. The fourth possibility requires a selection to be made in step three since both the upper and the lower sub-regions contain at least one valid entry but one sub-region must be ignored.

TABLE 2

| OR of upper sub-region's entries valid bits | OR of lower sub-region's entries valid bits | Result |
|---|---|---|
| Invalid | invalid | Do nothing, there are no valid entries in the entire region |
| Invalid | valid | Do nothing, none of the valid entries in the lower half should be ignored, and there are none in the upper half to be ignored |
| Valid | invalid | Do nothing, none of the valid entries in the upper half should be ignored, and there are none in the lower half to be ignored |
| Valid | valid | Choose all except one of the sub-regions to have its valid entries ignored |

The fourth possibility is where the pseudo-randomness of the algorithm is apparent. As shown in Table 3, each region is assigned a weighting in step two, if a particular region is assigned a weighting which is a logical zero signal, then the lower sub-region is ignored in the fourth case; conversely, if the weighting is a logical one signal, the upper sub-region is ignored in the fourth case.

TABLE 3

| OR of upper sub-region's entries valid bits | OR of lower sub-region's entries valid bits | Region Weighting | Result |
|---|---|---|---|
| invalid | invalid | NA | Do nothing, there are no valid entries in the entire region |
| invalid | valid | NA | Do nothing, none of the valid entries in the lower half should be ignored, and there are none in the upper half to be ignored |
| valid | invalid | NA | Do nothing, none of the valid entries in the upper half should be ignored, and there are none in the lower half to be ignored |
| valid | valid | logical zero | Ignore lower sub-region's valid entries |
| valid | valid | logical one | Ignore upper sub-region's valid entries |

The variability of the region weightings provides the technique with the pseudo-randomness and the deterministic feature. If all the weightings are assigned a logical one signal, the upper sub-regions will be consistently ignored, and the resulting entry chosen from the set will be the lowest valid entry in the entire set. If all of the weightings are set to logical zero, the lower sub-regions will be consistently ignored, and the result will be the highest valid entry in the set. If the entries are spatially organized in priority order, this method may be used to select the highest or lowest priority of the valid entries. Moreover, weightings may vary to generate a constantly-changing weighting which will pseudo-randomly select from the inbound valid entry set.

Figure 2:
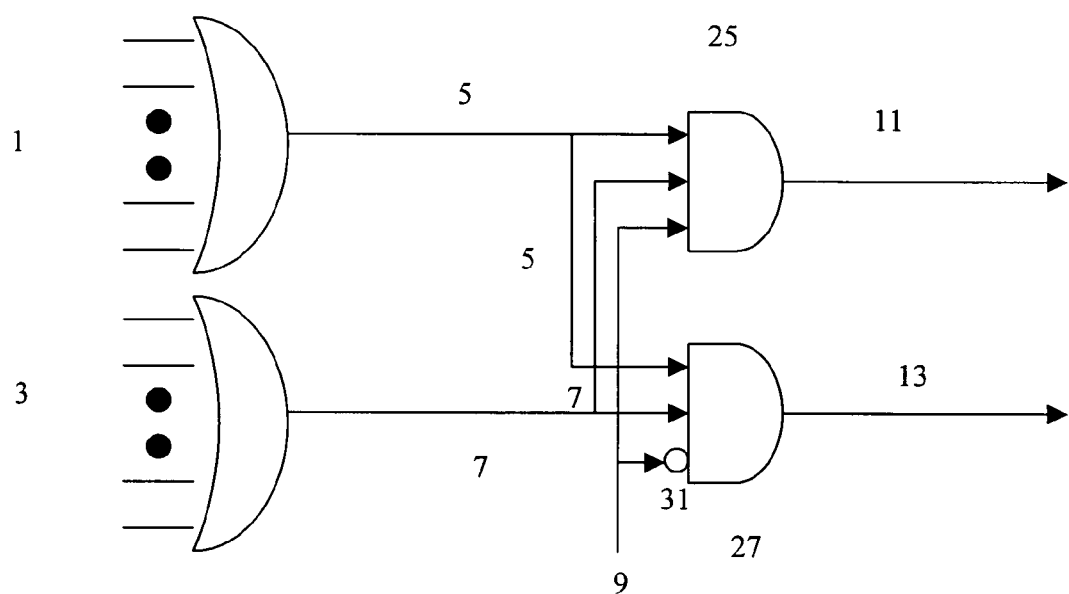
FIG. 2 is one embodiment of logic gates that outputs ignore signals for each sub-region.

FIG. 2 demonstrates the logic gates encompassing both step three and four for the embodiment illustrated in Table 1. The input signals 1 contain all the entries for the upper sub-region, the input signals 3 contain all the entries for the lower sub-region, and the weighting signal 9 for each region is necessary in cases where both signals 5 and 7 are valid. If at least one entry of the upper sub-region is valid, the signal 5 is valid, and if at least one entry of the lower sub-region is valid, the signal 7 is valid. The signals 11 and 13 are the ignore signals for the upper and lower sub-regions respectively. In cases where both the upper and lower sub-regions contain valid entries; if the output signal 11 is valid, then the upper sub-region is to be ignored, else if the output signal 13 is valid, then the lower sub-region is to be ignored.

In the first case where both signals 5 and 7 are invalid, signals 11 and 13 are also invalid because signal 5 is an input signal to the AND gate 25 which outputs signal 11, and signal 7 is an input signal to the AND gate 27 which outputs signal 13. Consequently, if one of the two signals 5 or 7 is invalid, both signals 11 and 13 are also invalid because signals 5 and 7 are both fed into the AND gates 25 and 27, which outputs signals 11 and 13 respectively. Furthermore, the weighting signal 9 is inconsequential in the first three cases since in each case there is at most one sub-region that contains any valid entry. Although the ignore signals for the first three cases are invalid for each sub-region, the last step of the process filters out any sub-region that encompasses only invalid entries. Whereas the signal 9 is unnecessary for the first three case listed in table 2, it is crucial for the last case where both the signals 5 and 7 are valid. If the signal 9 is valid in the fourth case, the AND gate 25 receives a valid signal from signal 5, a valid signal from signal 7, a valid signal from signal 9, and outputs a valid signal to signal 11 that signifies the valid entries 1 from the upper sub-region would be ignored. If the signal 9 is invalid in the last case, the signal 9 is negated by the NOT gate 31, thus the AND gate 27 receives a valid signal from signal 5, a valid signal from signal 7, a valid signal from the negated signal 9, and outputs a valid signal to signal 13 which signifies that the valid entries 3 from the lower sub-region would be ignored.

Figure 3:
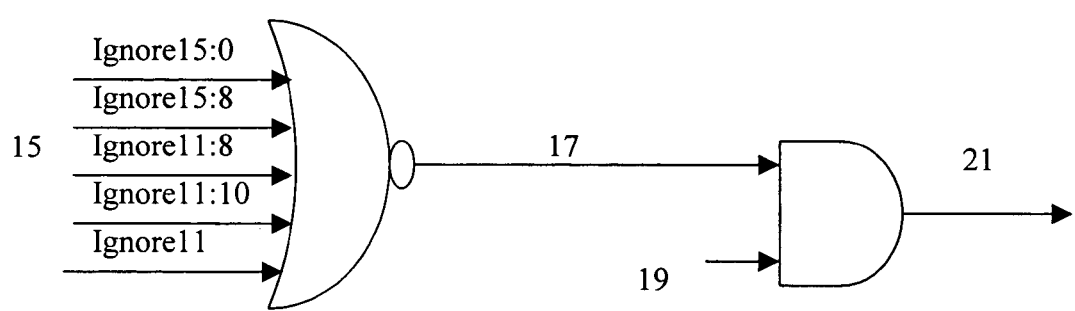
FIG. 3 is one embodiment of logic gates that combines the relevant ignore signals and each entry's original validity to eliminate all but one valid output entry.

FIG. 3 shows the last step applied to entry 11 of the embodiment in Table 1. The input signals to the OR gate are the ignore signals of all sub-regions encompassing the entry 11. If any one of the ignore signals is valid, the signals 17 and 21 are invalid and the entry 11 is ignored. If the original validity of the entry is invalid, the signals 19 and 21 are invalid and the entry 11 is also ignored. If both the signal 17 is valid (i.e. all sub-regions that contain the entry are selected in step four) and the original entry is valid, then the entry is chosen as the final output. Step four is applied to each entry in the range of entries and one entry is selected as output, provided that at least one entry is valid.

For pseudo-random operations, the weighting for each region is changed on a regular basis. As an example, assume a set of 128 entries that comprises regions of seven different sizes: 128, 64, 32, 16, 8, 4, and 2. If the outputs of a simple seven bit counter were used as the weightings for the seven region sizes, the weightings would be repeated only once per 128 lookups. In this case, if there were identical patterns of valid entries, they would be guaranteed to be identically selected only once every 128 lookups.

What is claimed is:

1. A computer implemented method for random selection between valid entries, comprising method operations of:
   dividing a range of entries into regions;
   dividing each of the regions into at least two sub-regions;
   assigning a weighting value having two states to each of the regions;
   determining whether valid entries exist in each of the at least two sub-regions;
   if valid entries exist in two of the at least two sub-regions, then the method includes, ignoring one of the at least two sub-regions for each of the regions according to the weighting value.

2. The method of claim 1, wherein the two states of the weighting value are a logical 1 and a logical 0.

3. The method of claim 1, wherein the method operation of determining whether valid entries exist in each of the at least two sub-regions includes,
   performing a logical OR operation where each corresponding entry associated with each of the at least two sub-regions is used as an input signal.

4. The method of claim 3, wherein the method operation of determining whether valid entries exist in each of the at least two sub-regions includes,
   performing a logical AND operation where output from the logical OR operation is used as an input signal.

5. The method of claim 4, further comprising:
   including the weighting value as an input for the logical AND operation.

6. The method of claim 1, further comprising:
   changing the weighting value according to a predetermined pattern.

7. An apparatus for performing a deterministic psuedo-random operation, comprising:
   first and second OR gates configured to receive entry signals associated with a region that generates the entry signals, the first OR gate receiving entry signals associated with a first sub-region of the region, the second OR gate receiving entry signals associated with a second sub-region of the region;
   first and second AND gates configured to receive output signals from both the first and second OR gates, the first and second AND gates further configured to receive a weighting value associated with the region;
   a NOR gate receiving output from the first and second AND gates; and
   an AND gate receiving output from the NOR gate and a validity signal associated with the region as onputs.

8. The apparatus of claim 7, further comprising:
   a counter in communication with the first and second AND gates, the counter generating the weighting value.

9. The apparatus of claim 8, wherein the counter periodically changes the weighting value according to a predetermined pattern.

10. The apparatus of claim 7, wherein the weighting value is one of a logical high or a logical low value.

* * * * *